US008114306B2

(12) United States Patent
Cheng et al.

(10) Patent No.: US 8,114,306 B2
(45) Date of Patent: Feb. 14, 2012

(54) METHOD OF FORMING SUB-LITHOGRAPHIC FEATURES USING DIRECTED SELF-ASSEMBLY OF POLYMERS

(75) Inventors: Joy Cheng, San Jose, CA (US); Kafai Lai, Hopewell Junction, NY (US); Wai-Kin Li, Hopewell Junction, NY (US); Young-Hye Na, San Jose, CA (US); Charles Rettner, San Jose, CA (US); Daniel P. Sanders, San Jose, CA (US); Da Yang, Hopewell Junction, NY (US)

(73) Assignee: International Business Machines Corporation, Armonk, NY (US)

( * ) Notice: Subject to any disclaimer, the term of this patent is extended or adjusted under 35 U.S.C. 154(b) by 440 days.

(21) Appl. No.: 12/470,760

(22) Filed: May 22, 2009

(65) Prior Publication Data
US 2010/0297847 A1    Nov. 25, 2010

(51) Int. Cl.
*H01L 21/31* (2006.01)
*H01L 21/469* (2006.01)
*B32B 3/00* (2006.01)
*B05D 3/00* (2006.01)

(52) U.S. Cl. ............... 216/41; 216/46; 216/49; 216/17; 438/947; 438/700; 438/780; 257/E21.035; 257/E21.038; 257/E21.039

(58) Field of Classification Search .............. 216/41, 216/46, 49, 17; 438/947, 700, 780; 257/E21.035, 257/E21.038, E21.039
See application file for complete search history.

(56) References Cited

U.S. PATENT DOCUMENTS

| 6,630,404 | B1 | 10/2003 | Babcock |
| 7,405,147 | B2 | 7/2008 | Edelstein et al. |
| 7,514,339 | B2 | 4/2009 | Yang et al. |
| 2005/0158988 | A1 | 7/2005 | Lee et al. |
| 2005/0167838 | A1 | 8/2005 | Edelstein et al. |
| 2006/0078681 | A1 | 4/2006 | Hieda et al. |
| 2007/0175859 | A1* | 8/2007 | Black et al. ............ 216/41 |
| 2007/0224823 | A1 | 9/2007 | Sandhu |
| 2007/0293041 | A1* | 12/2007 | Yang et al. ............ 438/637 |

(Continued)

FOREIGN PATENT DOCUMENTS
WO    WO 2008130847 A1    10/2008

OTHER PUBLICATIONS

Wai-Kin Li et al., "Creation of sub-20-nm contact using diblock copolymer on a 300 mm wafer for complementary metal oxide semiconductor applications", J. Vac. Sci. Technol. B 25(6), Nov./Dec. 2007, pp. 1982-1984.

(Continued)

*Primary Examiner* — Lan Vinh
*Assistant Examiner* — David Kaufman
(74) *Attorney, Agent, or Firm* — Daniel E. Johnson

(57) ABSTRACT

Methods involving the self-assembly of block copolymers are described herein, in which by beginning with openings (in one or more substrates) that have a targeted CD (critical dimension), holes are formed, in either regular arrays or arbitrary arrangements. Significantly, the percentage variation in the average diameter of the formed holes is less than the percentage variation of the average diameter of the initial openings. The formed holes (or vias) can be transferred into the underlying substrate(s), and these holes may then be backfilled with material, such as a metallic conductor. Preferred aspects of the invention enable the creation of vias with tighter pitch and better CD uniformity, even at sub-22 nm technology nodes.

22 Claims, 11 Drawing Sheets

U.S. PATENT DOCUMENTS

| | | | |
|---|---|---|---|
| 2008/0085601 A1 | 4/2008 | Park et al. | |
| 2008/0093743 A1 | 4/2008 | Yang et al. | |
| 2008/0099845 A1* | 5/2008 | Yang et al. | 257/351 |
| 2008/0179667 A1* | 7/2008 | Yang et al. | 257/330 |
| 2008/0299353 A1 | 12/2008 | Stoykovich et al. | |
| 2009/0026574 A1 | 1/2009 | Kim et al. | |
| 2009/0093133 A1 | 4/2009 | Doris et al. | |
| 2009/0200646 A1* | 8/2009 | Millward et al. | 257/632 |
| 2009/0214823 A1* | 8/2009 | Cheng et al. | 428/137 |

OTHER PUBLICATIONS

Joy Y. Cheng et al., "Nanostructure engineering by templated self-assembly of block copolymers", Nature Materials vol. 3, Nov. 2004, pp. 823-828.

Joy Y. Cheng et al., "Fabrication of nanostructures with long-range order using block copolymer lithography", Applied Physics Letters, vol. 81, No. 19, Nov. 4, 2002, pp. 3657-3659.

Joy Y. Cheng et al., "Templated Self-Assembly of Block Copolymers: Top-Down Helps Bottom-Up", Advanced Materials, vol. 18, 2006, pp. 2505-2521.

Joy Y. Cheng et al., "Templated Self-Assembly of Block Copolymers: Effect of Substrate Topography", Advanced Materials, vol. 15, Oct. 2, 2003, pp. 1599-1602.

Sang-Min Park et al., "Patterning sub-10 nm line patterns from a block copolymer hybrid", Nanotechnology, vol. 19, No. 45, Nov. 2008, pp. 1-6.

Cheolmin Park et al., "Enabling nanotechnology with self assembled block copolymer patterns", Polymer, vol. 44, No. 22, Oct. 2003, pp. 6725-6760.

PCT International Search Report Dated Mar. 9, 2011, PCT Application No. PCT/EP2010/055412.

* cited by examiner

Directed Self Assembly

Pattern Transfer

Resist Prepatterns

CD=100nm

CD=80nm

CD=61nm

SA Contact Holes

CD=45nm

CD=42nm

CD=39nm avg. $r_1 < 100$ nm
avg. $r_2 < 100$ nm
avg. $r_3 < 100$ nm
avg. $r_4 < 100$ nm Directed Self Assembly $d_1 < r_1 + r_2$
$d_2 < r_2 + r_3$
$d_3 < r_3 + r_4$ Pattern Transfer

METHOD OF FORMING SUB-LITHOGRAPHIC FEATURES USING DIRECTED SELF-ASSEMBLY OF POLYMERS

TECHNICAL FIELD

The invention relates to methods of forming structures at the nanoscale level. More particularly, the invention relates to using block copolymers to form structures having holes that are relatively uniform in diameter.

BACKGROUND

A semiconductor device typically includes a network of circuits that are formed over a substrate. The device may consist of several layers of circuit wiring, with various interconnects being used to connect these layers to each other and any underlying transistors. Generally, as a part of the manufacturing process, vias or contact holes are formed in a patterning layer, transferred to an underlying layer, and then filled with a metal to form interconnects, so that the various layers of circuitry are in electrical communication with each other.

Prior art methods of forming interconnects generally rely on a series of lithographic and etching steps to define the positions and dimensions of the vias, which in turn define the positions and dimensions of the corresponding interconnects. To this end, photoresists and hard masks may be employed. However, the dimensions of features formed using conventional optical lithography techniques for volume manufacturing (e.g., 193 nm dry and immersion lithography) have reached the resolution limit of the lithographic tools. The creation of vias with adequate critical dimension (CD) uniformity at tighter pitch is one of major challenges for future technology nodes. The International Technology Roadmap for Semiconductors (ITRS) requires an overall CD variation (3 sigma variation, where sigma is the standard deviation of the critical dimension) of less than 10% of the CD to ensure reasonable device performance (see the ITRS Lithography Roadmap, 2007 Edition, pp. 12-13). However, this is expected to be difficult beyond the 22 nm node using conventional optical lithography, even with expensive and complicated double patterning processes, resolution enhancement technology (computational lithography), and severe layout design restrictions.

Block copolymer (BCP) patterning has attracted attention as a possible solution to the problem of creating patterns with smaller dimensions. Under the right conditions, the blocks of such copolymers phase separate into microdomains (also known as "microphase-separated domains" or "domains") to reduce the total free energy, and in the process, nanoscale features of dissimilar chemical composition are formed. The ability of block copolymers to form such features recommends their use in nanopatterning, and to the extent that features with smaller CDs can be formed, this should enable the construction of features which would otherwise be difficult to print using conventional lithography.

Directed self-assembly (DSA) is a potential candidate to extend the resolution limit of current lithography by generating self-assembling nanoscale domains on a lithographically defined patterned substrate. This is a method that combines aspects of self-assembly with a lithographically defined substrate to control the spatial arrangement of certain self-assembled BCP domains. One DSA technique is graphoepitaxy, in which self-assembly is guided by topographical features of lithographically pre-patterned substrates. BCP graphoepitaxy provides sub-lithographic, self-assembled features having a smaller characteristic dimension than that of the prepattern itself.

SUMMARY

The methods herein reduce CD variation, improve pattern fidelity, and increase the process window (e.g., exposure latitude) for arbitrarily located vias and the vertical interconnects formed in those vias. Preferred aspects of the invention enable the creation of vias with adequate CD uniformity at tight pitch (e.g., sub-22 nm node). Methods are disclosed in which a block copolymer is applied to a substrate having a collection of openings therein. Self-assembled domains form, leading to a central domain in each of the openings. The central domain can then be selectively removed, thereby forming a hole, which can be transferred to an underlying substrate.

In the event that each of the initial openings is meant to be cylindrically shaped, then each of the openings should ideally have a uniform diameter, and moreover, the diameter of each opening should be the same. In practice, however, each of these openings may deviate from this ideal, so that an appropriate metric for the CD of a single opening that is substantially cylindrical in shape is its average diameter. In addition, the CD may deviate from opening to opening. Nevertheless, even for a collection of initial openings having a relatively large variation in their respective critical dimensions (e.g., when the average diameter of one substantially cylindrical opening differs somewhat from that of another), the methods disclosed herein result in the formation of holes (following self-assembly of an applied polymer and an etch step) of relatively more uniform CD, compared to that of the initial openings.

One aspect of the invention is a method that includes providing a substrate with discrete openings whose targeted critical dimension (CD) is less than 200 nm, with the openings having a statistical variation in their CD characterized by a standard deviation $\sigma_{openings}$ and an average $CD_{openings}$, with $3\sigma_{openings}$ being at least 10% of the average $CD_{openings}$. The method also includes applying, over the substrate, a layer of polymer that includes a block copolymer, wherein components of the copolymer are immiscible with one another. The polymer is allowed to form, inside each of the openings, a self-assembled central domain within a surrounding self-assembled domain. The central domains are selectively removed, thereby forming a hole where each central domain was located, with the holes having a CD statistical variation characterized by a standard deviation $\sigma_{holes}$ and an average $CD_{holes}$, and in which $\sigma_{holes}$/average $CD_{holes}$ is less than 0.8 (or less than 0.7, or even less than 0.5) of $\sigma_{openings}$/average $CD_{openings}$. The method may further comprise transferring the holes into the substrate and backfilling the holes with a material. The substrate may include at least one of a resist, a hardmask, or an antireflection coating. The polymer may be annealed to induce formation of the self-assembled central domains and the surrounding self-assembled domains. The number of openings having the targeted CD may be at least 100, or even more, e.g., at least 1000. The discrete openings may be circular, in which case the targeted critical dimension can be a measure of the diameter of the circular openings. Alternatively, the discrete openings may be oval-shaped. The holes formed may be arranged in a periodic array, or they may not form a periodic array.

Another aspect of the invention is a method that includes providing a plurality of substrates each of which has openings whose targeted diameter is less than 200 nm, in which this targeted diameter is the same for each of the substrates. The openings have average diameters having a statistical variation (for all of the openings in the substrates) characterized by a standard deviation $\sigma_{openings}$ and an average diameter openings, with $3\sigma_{openings}$ being at least 10% of the targeted diameter. Over each of the substrates, a layer of polymer is applied that includes a block copolymer, with the components of the copolymer being immiscible with one another. The polymer is allowed to form, inside each of the openings in each of the substrates, a self-assembled central domain within a surrounding self-assembled domain. The central domains are selectively removed from each of the substrates, thereby forming a hole where each central domain was located. The holes have respective diameters and a statistical variation in their diameters (for all of the holes in the substrates) characterized by a standard deviation $\sigma_{holes}$ and an average diameter$_{holes}$. The ratio $\sigma_{holes}$/average diameter$_{holes}$ is less than 0.8 of $\sigma_{openings}$/average diameter$_{openings}$. The method may be applied to substrates concurrently (e.g., several substrates may be treated at once), or alternatively, the method may be applied to the substrates sequentially (to one substrate after another, as in an assembly line process).

Another aspect of the invention is a method that includes providing a substrate having a surface with an opening therein, with the opening having a boundary equivalent to that formed from overlapping holes whose targeted diameter is less than 200 nm. The holes have sidewalls that define protrusions where the sidewalls adjoin, and the overlapping holes have respective diameters and a statistical variation in their diameters characterized by a standard deviation $\sigma_{overlapping\ holes}$ and an average diameter$_{overlapping\ holes}$. A layer of polymer that includes a block copolymer is applied over the surface, in which components of the copolymer are immiscible with one another. The polymer is allowed to form a single discrete, segregated domain inside each portion of the opening corresponding to one of the holes. At least some of the discrete, segregated domains are then removed, thereby forming holes, with the formed holes having respective diameters and a statistical variation in their diameters characterized by a standard deviation $\sigma_{formed\ holes}$ and an average diameter$_{formed\ holes}$. The position of each discrete, segregated domain is predetermined by at least one sidewall and a protrusion that forms at least part of said at least one sidewall. Also, the discrete, segregated domains have respective geometric centers, and for any given domain, its center and the center of the given domain's nearest neighbor are separated by a distance that is less than the sum of the average radii of curvature of the holes corresponding to the sidewalls that predetermine the positions of the given domain and the given domain's nearest neighbor. In addition, $\sigma_{formed\ holes}$/average diameter$_{formed\ holes}$ is less than $\sigma_{overlapping\ holes}$/average diameter$_{overlapping\ holes}$, e.g., it may be 0.8 times or less. The method may also include transferring the formed holes into the substrate. In one example, $3\sigma_{overlapping\ holes}$ is at least 10% of the targeted diameter.

BRIEF DESCRIPTION OF THE DRAWINGS

FIGS. 1-4 show respective plan or top-down views (except FIG. 3D, which represents a 3-dimensional view, and FIGS. 2C, 2D, and 5B, which present data), in which:

FIG. 1, which includes

FIG. 2, which includes FIGS. 2A, 2B, 2C, and 2D, present experimental results related to the implementation shown in FIG. 1, in which FIGS. 2A and 2B are scanning electron microscopy (SEM) micrographs, and FIGS. 2C and 2D present results deduced from those and other micrographs;

FIG. 3, which includes

FIG. 4, which includes FIG. 5 includes FIGS. 5A and 5B, in which

DETAILED DESCRIPTION

Methods involving the directed self-assembly (DSA) of block copolymers are described herein, in which self-assembled domains are formed within openings in one or more substrates (with these openings having a preselected or targeted CD (e.g., a diameter if the hole is circular)). Selective removal of the specific self-assembled domains produces holes which are smaller than the original openings. These holes can be located in either regular arrays or arbitrary arrangements. Significantly, the percentage variation in the CD of the formed holes is less than the percentage variation of the CD the initial openings. The formed holes (or vias) can be transferred into the underlying substrate(s), and these holes may then be backfilled with material, such as a metallic conductor.

1. Directed Self-Assembly Using Discrete, Cylindrical Openings in a Substrate

Figure 1A:
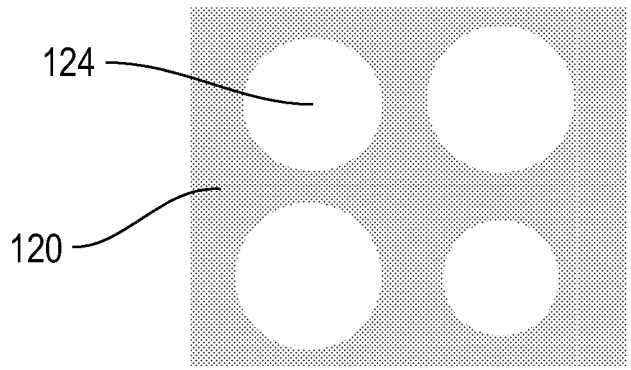
FIGS. 1A, 1B, and 1C, illustrates an implementation of the invention, in which beginning with circular openings in a substrate, smaller holes can be formed using a polymer layer including at least a block copolymer, and in which the percentage variation in the CD of the formed holes from self-assembled domains is less than the percentage variation in the CD of the initial openings.

By way of example, FIG. 1A shows a plan view of a substrate 120 having openings 124 therein. (The term "substrate" is used broadly to mean any physical structure suitable for use with any of the methods described herein, including but not necessarily limited to substrates used in the semiconductor industry.) For the sake of clarity, only four openings 124 are shown in FIG. 1, although in practice, many more openings would typically be used, e.g., hundreds, thousands, or even more.

When multiple openings are created, these openings have a statistical distribution of CDs (e.g., diameters in this example of cylindrical openings). It is useful to characterize this statistical distribution of CDs by the average (mean) CD and the sample standard deviation $\sigma$. The sample standard deviation ($\sigma$) is a measure of how widely values are dispersed from the average value (the mean). The sample standard deviation ($\sigma$) is determined by the following formula:

$$\sigma = \sqrt{\frac{\sum_{i=1}^{n}(CD_i - CD_{AVERAGE})^2}{(n-1)}}$$

where $CD_{AVERAGE}$ is the sample mean and n is the sample size.

When fabricating structures for integrated circuits, the size and size uniformity of features are critical to proper functioning of the device. During the device design, a targeted critical dimension of a feature and a tolerance value are specified. Typically, the allowed tolerance is 10% of the nominal CD and is commonly expressed as an integral multiple of σ (usually 3σ). In other words, three times the sample standard deviation of CD should be less than 10% of the target CD. Additional details are given in "Handbook of Semiconductor Manufacturing Technology", Y. Nishi, R. Doering, eds., New York: Marcel Drekker, 2000.

The openings 124 have a targeted critical dimension or CD (in the case of FIG. 1, a targeted diameter), but nevertheless have significant size variation of at least 10% (3 σ>10% CD). This situation can arise, for example, when the openings are formed using optical lithography, and the openings are so small that the lithographic tool cannot produce openings with adequate CD uniformity, e.g., when working at or near the resolution limit. Each of the openings 124 has sidewalls (not shown) that are vertical or substantially vertical (i.e., perpendicular to the substrate 120).

Figure 1B:
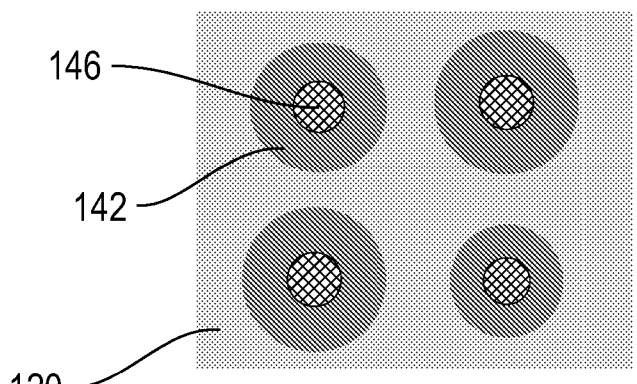

A directed self-assembly (DSA) formulation containing a block copolymer (and possibly other additives, as described below) is coated on the substrate 120, as indicated by FIG. 1B. For each opening 124, the block copolymer phase separates into domains 142, 146, with a single central domain 146 being surrounded by the domain 142. Depending upon the type of block copolymer used, this self-assembly can occur spontaneously or be induced, e.g., as a result of an annealing process. On the sidewalls of the openings 124, there may (or may not) be a thin coating of the polymer (brush layer) corresponding to the domain 142 as a result of this phase separation process, depending upon the surface chemistry of the prepattern and the composition of the block copolymer used.

Figure 1C:
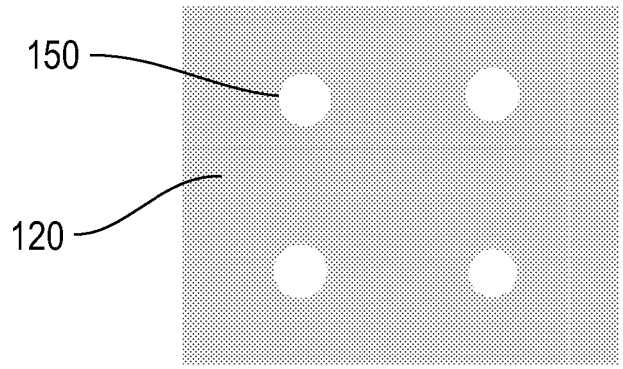

As indicated in FIG. 1C, the domains 146 may be selectively removed to form holes that can then be transferred to the underlying substrate 120, thereby forming a pattern of contact holes or vias 150. The domains 146 may be removed, for example, by using a development process (such as developing them in aqueous base developer), by dissolving them in solvent, or by etching them away with a plasma. The process selectively removes the polymer of the domains 146 while leaving behind the polymer of the domains 142. The resulting vias 150 advantageously enjoy a smaller percentage variation in their average diameters (the critical dimension, in this example) than do the initial openings 124.

It is non-trivial to measure the CD of the self-assembled domains directly. Herein, the CDs of the final resulting vias were measured instead. It should be understood that the critical dimension of the final vias can be significantly impacted by the choice of method used to selectively remove the domains 146. Herein, an oxygen plasma etch process has been employed to selectively remove the domains in order to closely replicate the CD of the domain 146 in the CD of the via. No particular selective removal processes were employed to intentionally reduce the CD or CD variation during the selective removal of the domains 146.

Various metrology and image analysis tools are available to determine the CD of the initial openings and resulting vias. For example, the critical dimensions can be determined by analyzing the SEM images. The CD of nearly circular holes and the lengths of major and minor axes of oval holes in the examples disclosed herein are determined using the SuMMIT contact analysis tool box (developed and licensed by the software division of EUV Technology, Martinez, Calif.), and a preset recipe of edge detecting parameters was optimized for the SEM images of initial openings and resulting/created holes. Metrology issues with respect to measuring critical dimensions are discussed in H. M. Marchman, "Critical Dimensional Metrology" in *Microlithography: Science and Technology*, J. R. Sheats, B. W. Smith, eds. New York: Marcel Dekker, 1998, chapter 12.

EXAMPLE 1

Figure 2A:
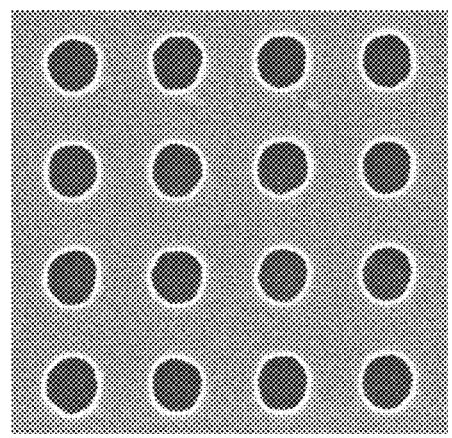
Figure 2A:
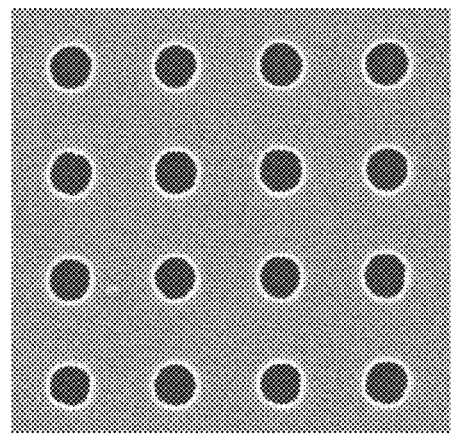
Figure 2A:
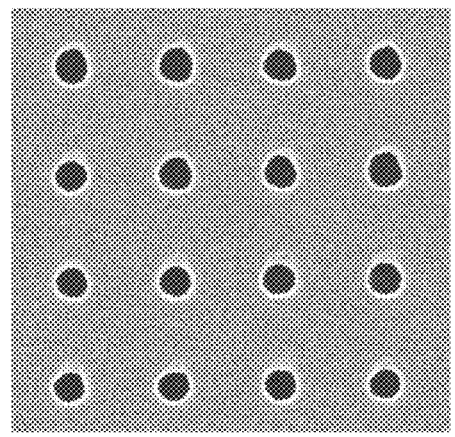
Figure 2B:
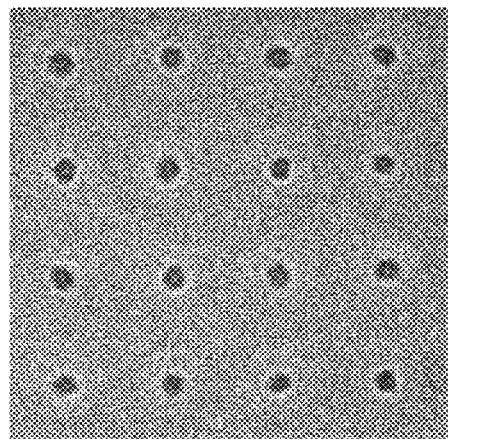
Figure 2B:
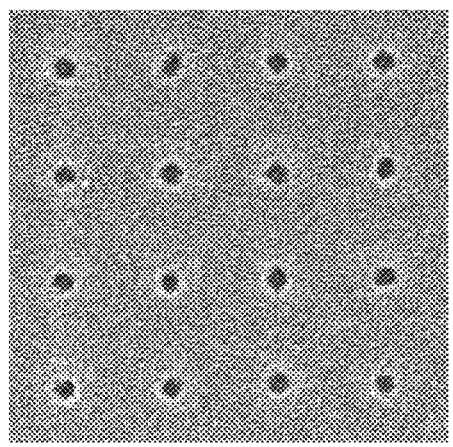
Figure 2B:
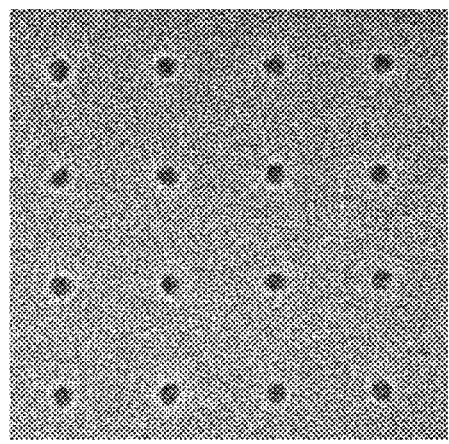

A layer of a di-block copolymer of polystyrene (PS) and polymethylmethacrylate (PS-b-PMMA, 96 kg/mol—35 kg/mol, from polymer source) was spun-cast onto a substrate that included a hardened 193 nm resist (JSR AM2073J) pattern having openings whose diameters ranged from 60 nm to 100 nm. (The openings had been previously created in a photoresist on the substrate by e-beam lithography, since e-beam lithography allows large numbers of different test patterns to be made rapidly without the need for creating expensive photomasks or using state-of-the-art 193 nm immersion lithography tools. However, both Example 1 and Example 2 (see below) can be replicated using optical lithography.) The self-assembled polymer was baked at 200° C. for 5 minutes, and then the exposed PMMA was removed by oxygen plasma to generate holes. FIG. 2A shows openings in different portions of the same substrate prior to the polymer being applied (analogous to the openings 124 in FIG. 1A), whereas FIG. 2B shows the resulting holes following the etch step (analogous to the holes 150 in FIG. 1C). In particular, FIG. 2A shows arrays of representative openings whose CDs (average diameters in this particular example) are 100 nm, 80 nm, and 61 nm (with each of these numbers representing a statistical average of about 50-100 openings). FIG. 2B indicates that the CDs (average diameters in this particular example) of the corresponding contact holes are 45 nm, 42 nm, and 39 nm, respectively (with each of these numbers once again representing a statistical average).

Although the CDs of the initial openings range from 100 nm to 61 nm (compare the top and bottom panels of FIG. 2A), the CDs of the ensuing contact holes range from 45 nm to only 39 nm (compare the top and bottom panels of FIG. 2B). This suggests that a self-assembly process not only can produce vias with smaller critical dimensions than the original openings, but the resulting vias will have a smaller percentage CD variation relative to the percentage CD variation of the original openings. As such, for a given desired percentage variation in the CDs of the resulting vias, the corresponding allowable percentage variation in the CDs of the initial openings may be relaxed to a somewhat greater value due to the benefits of the self-assembly process. This fact allows for larger process latitude when constructing the initial openings with, for example, an optical lithographic technique at or near its resolution limit.

Figure 2C:
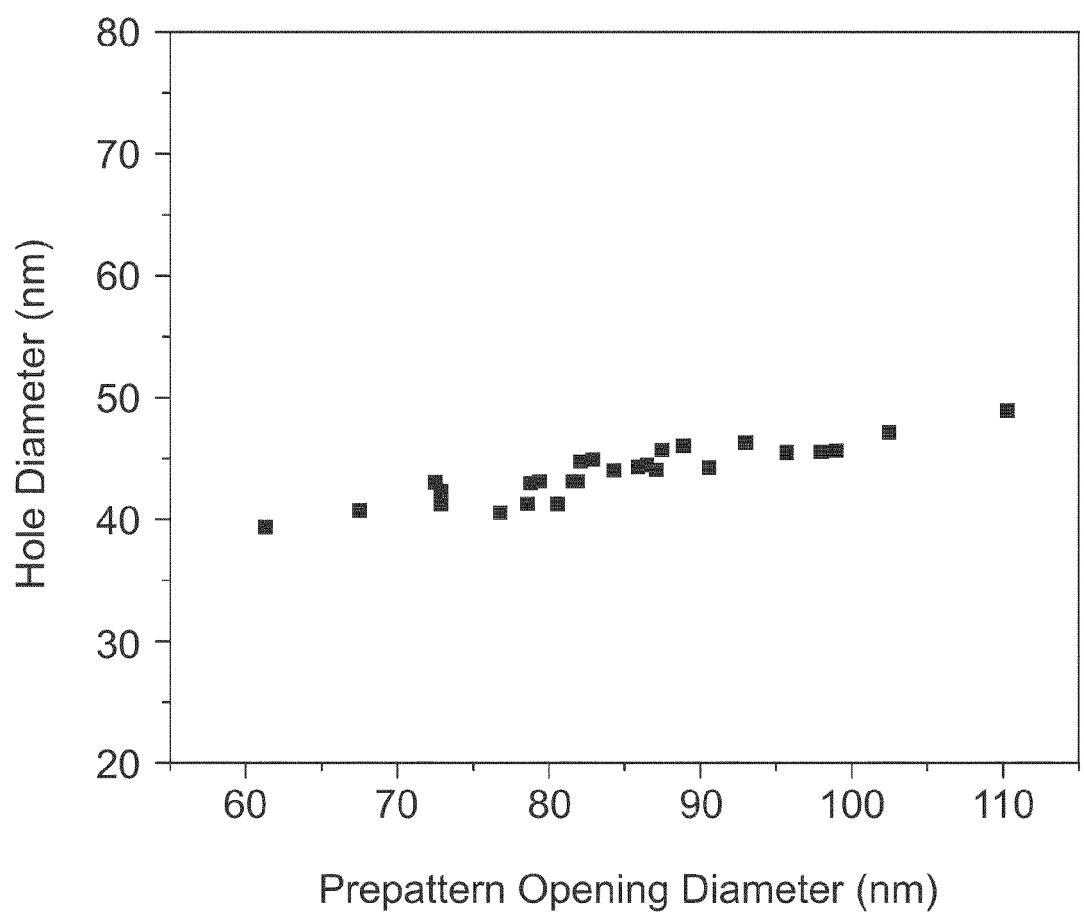

In FIG. 2C, the average CD of the resulting vias (see FIG. 2B) is plotted against the average CD of the initial opening (see FIG. 2A). The three data points represented by FIGS. 2A and 2B [(61, 39); (80, 42); (100, 45)] are included in FIG. 2C, as well as additional data that are consistent with those data points.

It is helpful to introduce a measure of how a variation in the CDs of the initial openings manifests itself in the variation of the CDs of the contact holes or vias. The measure introduced herein is called the "self-assembly error factor" (SEF). In particular, SEF is defined here as the percentage variation in the CDs of the resulting vias (i.e., normalized to the average CD of these vias) divided by the corresponding percentage variation in the CDs of the initial openings (i.e., normalized to the targeted opening diameter or more precisely, normalized to the average CD of all the initial openings). While the SEF is calculated with respect to the average CD of initial openings, ideally the average CD should be identical to the targeted CD.

$$SEF = \frac{\% \ CD \ variation_{resulting \ vias}}{\% \ CD \ variation_{initial \ openings}}$$

$$SEF = \frac{\frac{\Delta CD_{resulting \ vias}}{Average \ CD_{resulting \ vias}}}{\frac{\Delta CD_{initial \ openings}}{Average \ CD_{initial \ openings}}}$$

$$= \frac{\Delta CD_{resulting \ vias}}{\Delta CD_{initial \ openings}} \cdot \frac{Average \ CD_{initial \ openings}}{Average \ CD_{resulting \ vias}}$$

The average $CD_{initial \ openings}$ and average $CD_{resulting \ vias}$ are easily measured. Herein, the $\Delta CD_{resulting \ vias}/\Delta CD_{initial \ openings}$ term was calculated from the instantaneous slope of the data plotted in FIG. 2C. This method may be the most rigorous method for calculating SEF, because SEF is not a perfectly linear function. However, in some cases, it may be more convenient to measure the standard deviations of the resulting vias and initial openings and substitute $\sigma_{resulting \ vias}/\sigma_{initial \ openings}$ for $\Delta CD_{resulting \ vias}/\Delta CD_{initial \ openings}$ in the SEF equation.

If the self-assembly process were to increase the percentage CD variation of the resulting vias with respect to the percentage CD variation of the initial openings, the value for SEF would be greater than one. If the self-assembly process merely replicated the percentage variation of the resulting vias relative to the percentage CD variation of the initial openings, the value for SEF would be one. Unexpectedly, the percentage CD variation (error) of the initial openings was found to be mitigated (reduced) by the self-assembly process, so that the percentage CD variation of the resulting vias was less than that of the initial openings, i.e., the observed values for SEF reported herein are significantly less than one. Accordingly, SEF can also be called the "self-assembly error reduction factor" (SERF). In optical lithography, the mask error factor (MEF) and the mask error enhancement factor (MEEF) are commonly used to describe the error induced in a photoresist pattern due to the non-uniformity of features on the photomask. Although the SERF and "mask error enhancement factor" (MEEF) describe different physical phenomena and result from different processes, the mathematical formalism underlying these two concepts is similar.

Figure 2D:
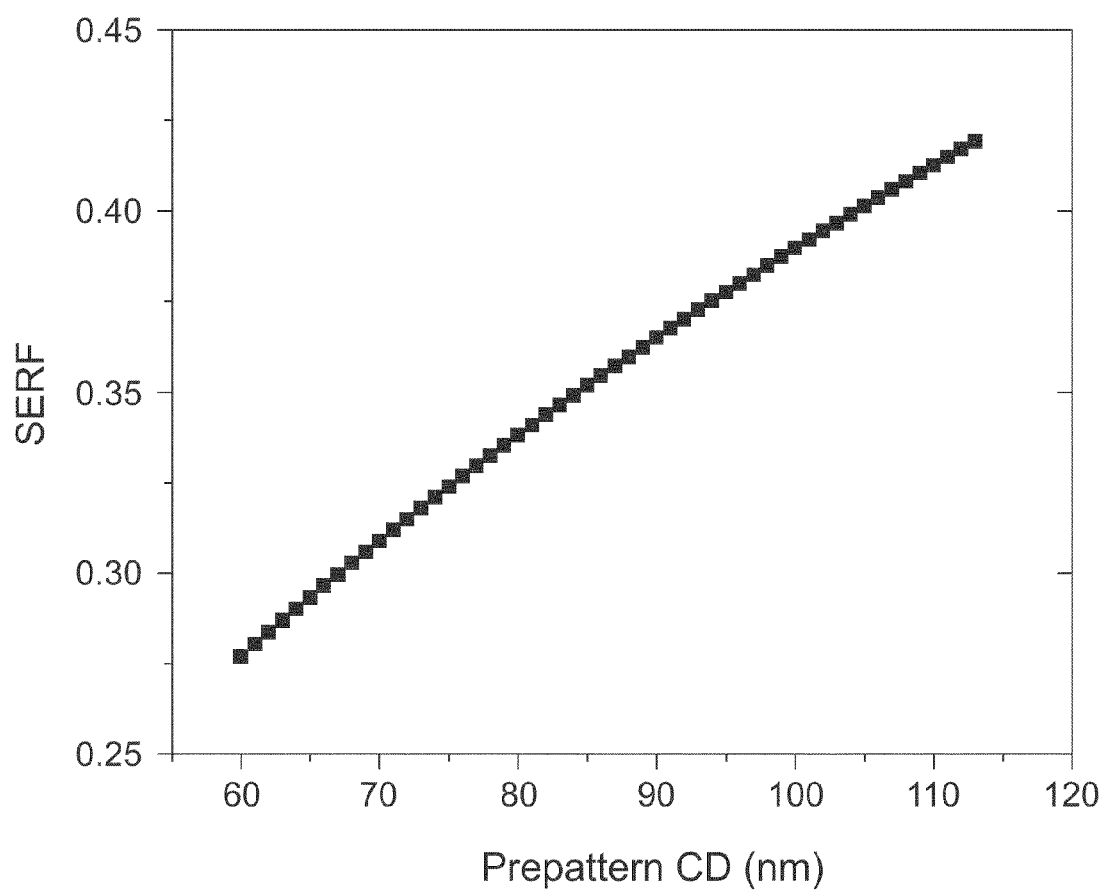

The SERF is a measure of how much the percentage variation in the CDs of the resulting vias is reduced with respect to the percentage variation in the CDs of the initial openings. In FIG. 2D, the SERF is plotted for the data shown in FIG. 2C, and for a given suitable block copolymer, the SERF decreases with a decreasing initial opening diameter. That is to say, the effectiveness of a suitable block copolymer assembly process in reducing the percentage CD variation of the final holes with respect to the initial openings is greater for smaller initial openings (i.e., the SERF is smaller at smaller initial opening CDs). For example, for an initial opening with an average CD of 100 nm, the SERF is about 0.39, whereas at 60 nm, the SERF is about 0.27. Thus, for a targeted initial diameter of 100 nm, the percentage CD variation (i.e., the variation normalized to average CD) of the resulting vias is 0.39 that of the percentage CD variation (i.e., the variation normalized to average CD) of the initial openings. In other words, the directed self assembly of polymeric materials is less sensitive to the size of the initial opening or prepattern than expected. Lithographic errors (such as MEEF) usually increase when attempting to produce very small openings; however, herein it is demonstrated that appropriately designed block copolymer assembly processes can exhibit the opposite behavior and afford reduced error (or variations) for smaller openings. In such a manner, the SERF from the DSA processes disclosed herein can compensate for the increased MEEF resulting from an imaging process used to fabricate the small initial openings.

2. Directed Self-Assembly Using Segmented, Prepatterned Openings in a Substrate

Beyond the 22 nm node, optical lithography may be incapable of the resolution required to create discrete openings that would lead to the formation of a single self-assembled hole within each opening. In practice, overlapping discrete openings may merge to form one or more segmented prepatterned openings within a substrate. For example, such merging may occur when the positive resist is overexposed or the negative resist is underexposed. A segmented prepatterned opening has a number of directing features or "protrusions" that direct and control the position of each self-assembled domain to achieve the desired placement accuracy. In addition, a self-healing effect (i.e., a reduction in the percentage variation in the CD of the resulting vias with respect to the percentage variation in the CD of the initial openings) is also observed with these segmented prepatterned openings. A segmented prepatterned opening can be considered to be the result of combining a number of overlapping discrete (typically cylindrical) holes, each of which is of a dimension that can be resolved by optical lithography.

Figure 3A:
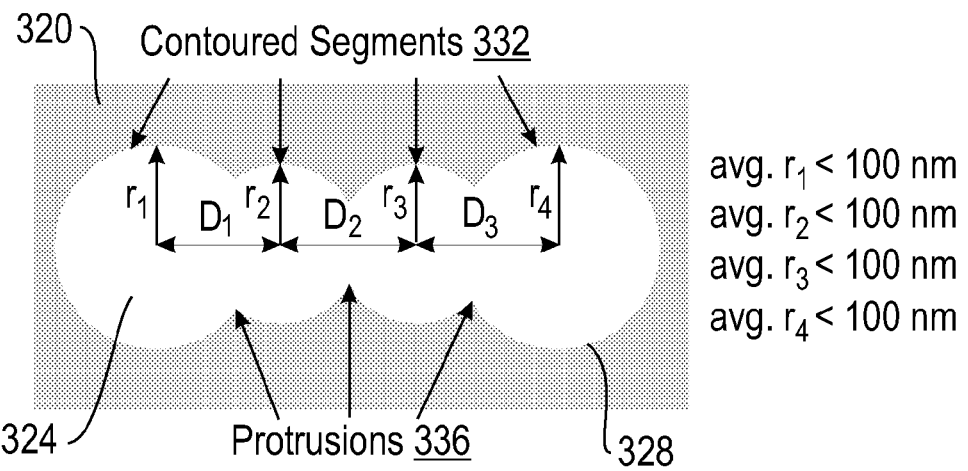
FIGS. 3A, 3B, 3C, and 3D illustrates an implementation of the invention, in which multiple holes are formed within a segmented prepattern using a polymer assembly that includes a block copolymer, and in which the percentage variation in the CD of the holes from self-assembled domains is less than the percentage variation in the CD of the overlapping holes that make up the initial openings.

Accordingly, in an alternative implementation of the invention, a substrate may be used that has a segmented prepattern (of a certain geometry), thereby facilitating good placement accuracy of the self-assembled domains. By way of example, FIG. 3A illustrates a plan view of a substrate 320 having an opening 324 therein, whose geometry will now be described. FIG. 3D shows the corresponding 3-dimensional representation and should be viewed in conjunction with FIG. 3A. The opening 324 can be thought of as arising from the overlap of more than one hole in the substrate 320. Each of the overlapping holes is cylindrical in form, having sidewalls 328 that are vertical or substantially vertical (i.e., perpendicular to the substrate). The boundary of the opening 324 (at the surface of the substrate 320) thus can be viewed as the overlap of circles that, in the case of cylinders (which have vertical sidewalls), are the projection of the cylindrical holes onto the plane of the substrate. The perimeter of the opening 324 (at the surface of the substrate 320) is therefore defined by the circular arcs 332 associated with these overlapping circles, each of which has a radius of curvature. In other words, FIG. 3A can be regarded as showing a planar cross section of the sidewalls 328 taken at the top of the sidewalls (i.e., at the top surface of substrate 320). The perimeter of the sidewalls within this plane is defined by circular arcs 332 having respective radii of curvature $r_j$ of less than 100 nm.

More generally, the overlapping holes may be contoured and convex but may not be ideally cylindrical, so that an average radius of the hole at the surface of the substrate 320 may be used instead. For example, the cross sections of the holes may deviate from circles, and the sidewalls may be sloped (conical holes) or have more complex shapes (e.g., as with a teardrop shaped holes). For these more complex cases, the average radius of curvature may be taken as the radius of the equivalent cylindrical hole having the same displacement volume. The sidewalls 328 of the opening 324 adjoin where the holes intersect, where the sidewalls define protrusion members or protrusions 336. Thus, a given protrusion 336 may be viewed as part of, and formed from, two adjacent sidewalls.

While the segmented prepatterns shown in FIG. 3A arise from the overlap of circular holes, in practice the actual holes of a given opening may not be ideally circular due to limitations of the lithography, including the non-ideal response of the resist or other processing steps. It should be understood that such deviations are considered to be within the scope of this invention. For any segment having a non-circular contour, its average radius of curvature can be determined using an algorithm based on the Hough transform (see, for example, William K. Pratt, "Digital Image Processing", second edition, Wiley-Interscience Publication, ISBN 0-471-85766-1, 1991).

For the sake of clarity, the opening 324 shown in FIG. 3A is formed from only four cylindrically shaped holes, although in practice, the opening 324 could be formed from many more than just four holes, e.g., it could be formed from hundreds, thousands, or even more holes. Each of the smaller holes that makes up the opening 324 has the same target CD (in this case, a target diameter), but nevertheless these smaller holes may have significant size variation, e.g., of at least 10% ($3\sigma > 10\%$ CD).

Figure 3B:
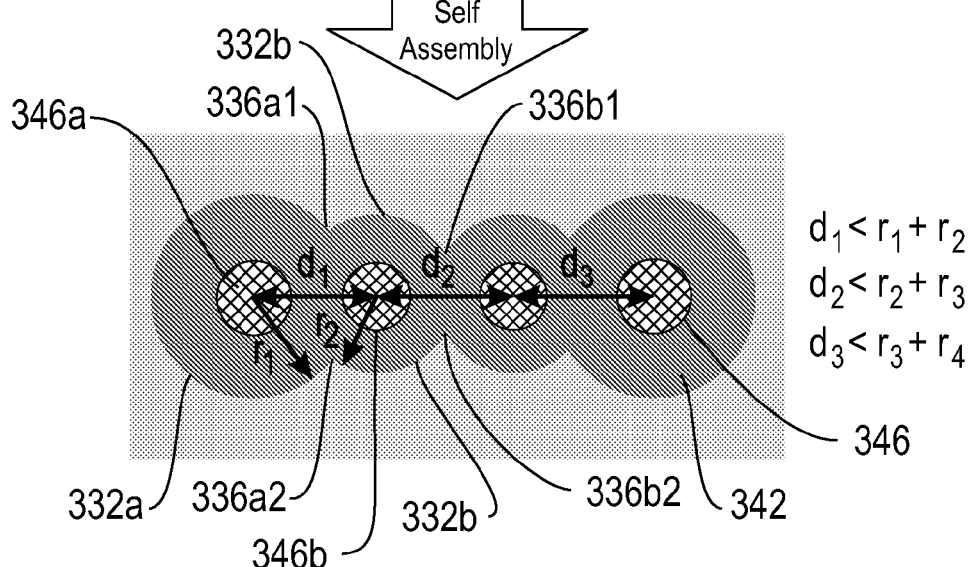

As shown in FIG. 3B, a formulation containing a block copolymer (and possibly other additives, as described below) is applied over the substrate 320 and annealed to form domains 342, 346. As shown in FIG. 3B, the domains 342, 346 phase separate, with domain 346 being surrounded by domain 342. In a preferred implementation, no more than a single domain 346 is formed within each cylindrically shaped hole that forms a part of the segmented prepattern opening 324. On the sidewalls 328 there may (or may not) be a thin coating of the polymer (brush layer) corresponding to the domain 342 as a result of this phase separation process, depending upon the surface chemistry of the prepattern and the composition of the block copolymer used.

Figure 3C:
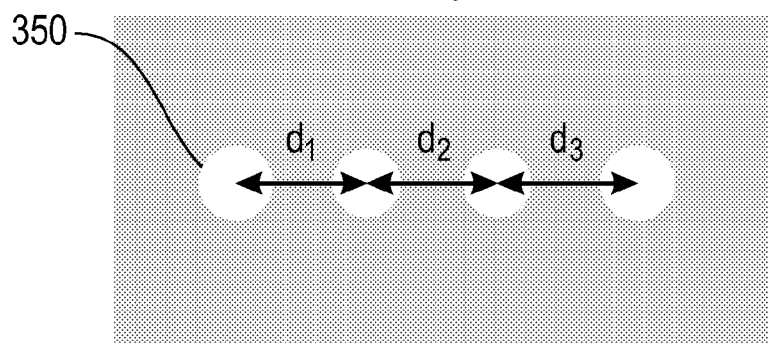
Figure 3D:
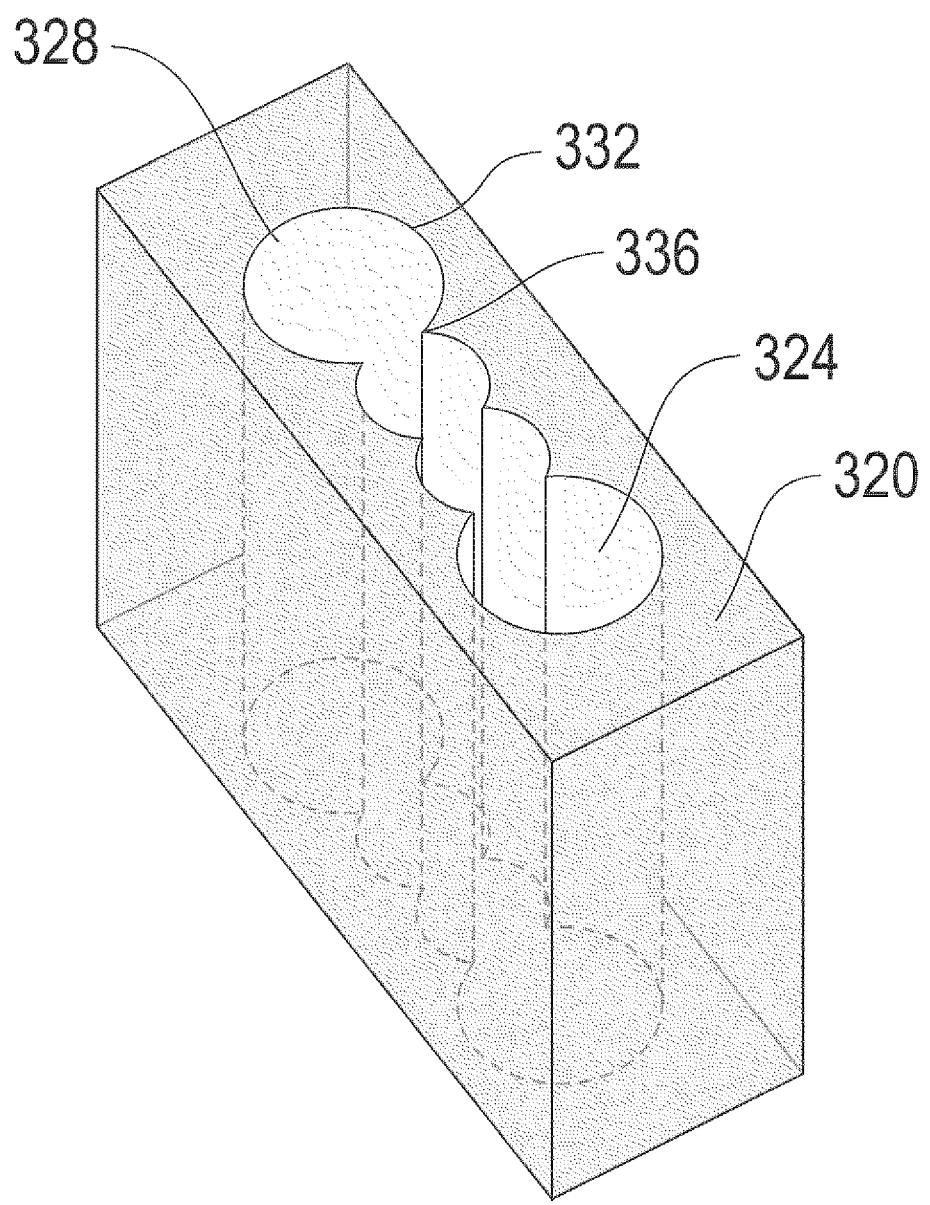

The self-assembled, discrete segregated domains 346 have respective geometric centers whose positions are determined by at least one sidewall 328 and its corresponding protrusion(s) 336. For example, the position of the geometric center of domain 346a is determined by the sidewall corresponding to segment 332a extending between the two protrusions 336a1 and 336a2, with assistance from those two protrusions. On the other hand, the geometric center of the adjacent domain 346b is determined by two sidewalls corresponding to segments 332b (extending between respective pairs of protrusions 336a1 and 336b1, and 336a2 and 336b2), with assistance from those four protrusions. Thus, the sidewalls 328 with their protrusions 336 may be viewed as "directing features", since they predetermine the location of (or direct) the domains 346 at points where their respective free energies are minimized. As indicated in FIG. 3C, the domains 346 may be selectively removed to form holes that can then be transferred to the underlying substrate 320, thereby forming a pattern of contact holes or vias 350. The domains 346 may be removed, for example, by using a development process (such as developing them in aqueous base developer), by dissolving them in solvent, or by etching them away with a plasma. The selected process removes the polymer of the domains 346 while leaving behind the polymer of the domains 342.

As indicated in FIG. 3A, the various segments 332 may be viewed as portions of circles whose centers are separated by respective distances $D_j$. Indeed, the perimeter of the sidewalls 328 (at the surface of the substrate 320) can be defined by distances $D_j$ and radii of curvature $r_j$ associated with the segments 332. Furthermore, the geometrical centers of the discrete segregated domains 346 are located such that adjacent segregated domains are separated by a distance $d_j$ that is less than the sum of a) the average radius of curvature of the segment (or the mean (arithmetic average) of the average radii of curvature of the segments) corresponding to the (at least one) sidewall that predetermines the position of the given domain and b) the average radius of curvature of the segment (or the mean of the average radii of curvature of the segments) corresponding to the (at least one) sidewall that predetermines the position of the given domain's nearest neighbor. That is, if only one sidewall determines the position of a certain domain (as is the case with domain 346a), then the average radius of curvature of the corresponding segment (332a) is used in calculating this sum, but if multiple sidewalls determine the position of a certain domain (as is the case with domain 346b), then the mean of the various radii of curvature of the segments (332b, top and bottom) corresponding to those multiple sidewalls is used. As indicated in FIG. 3B: $d_1 < r_1 + r_2$; $d_2 < r_2 + r_3$; and $d_3 < r_3 + r_4$. In the preferred case that the centers of the segregated domains 346 are located at the centers of the circles corresponding to the segments 332, then $D_j = d_j$.

The contoured sidewalls 328 and their protrusions 336 can be formed with optical lithography, so that the domains 346 (and thus their corresponding vias 350) can be positioned according to a preselected layout. In general, the discrete, segregated domains need not be necessarily aligned along a single axis, but rather they may be arranged in the form "rows", "columns", "diagonals", etc. Because the adjacent discrete segregated domains 346 are separated by a distance that is less than the sum of the average radii of curvature of the corresponding circles (e.g., see FIG. 3B), the segregated domains 346 (and their corresponding holes 350) can be "printed" at a desired aerial density with lower resolution lithography than would otherwise be needed. Accordingly, the segregated domains 346 (and their corresponding holes 350) do not need to conform to any particular symmetry or natural periodicity of block copolymers. For example, by extending the rows of FIG. 3 and forming additional rows, a standard square grid layout can be formed. Furthermore, the center-to-center distance between adjacent discrete segregated domains 346 can be predetermined by the sidewalls corresponding to segments 332 or by other directing features.

As noted above in connection with FIG. 3A, each of the smaller holes that makes up the opening 324 has the same target CD (so that ideally $r_1$, $r_2$, $r_3$, and $r_4$ would be the same), but nevertheless these smaller holes may have significant size variation (e.g., of at least 10% in their average diameters, $3\sigma > 10\%$ CD), e.g., due to limitations of the lithographic process used to form them. However, the CD variation of the resulting vias 350 is less than the CD variation of initial openings, and may be substantially less than this.

EXAMPLE 2

Figure 4A:
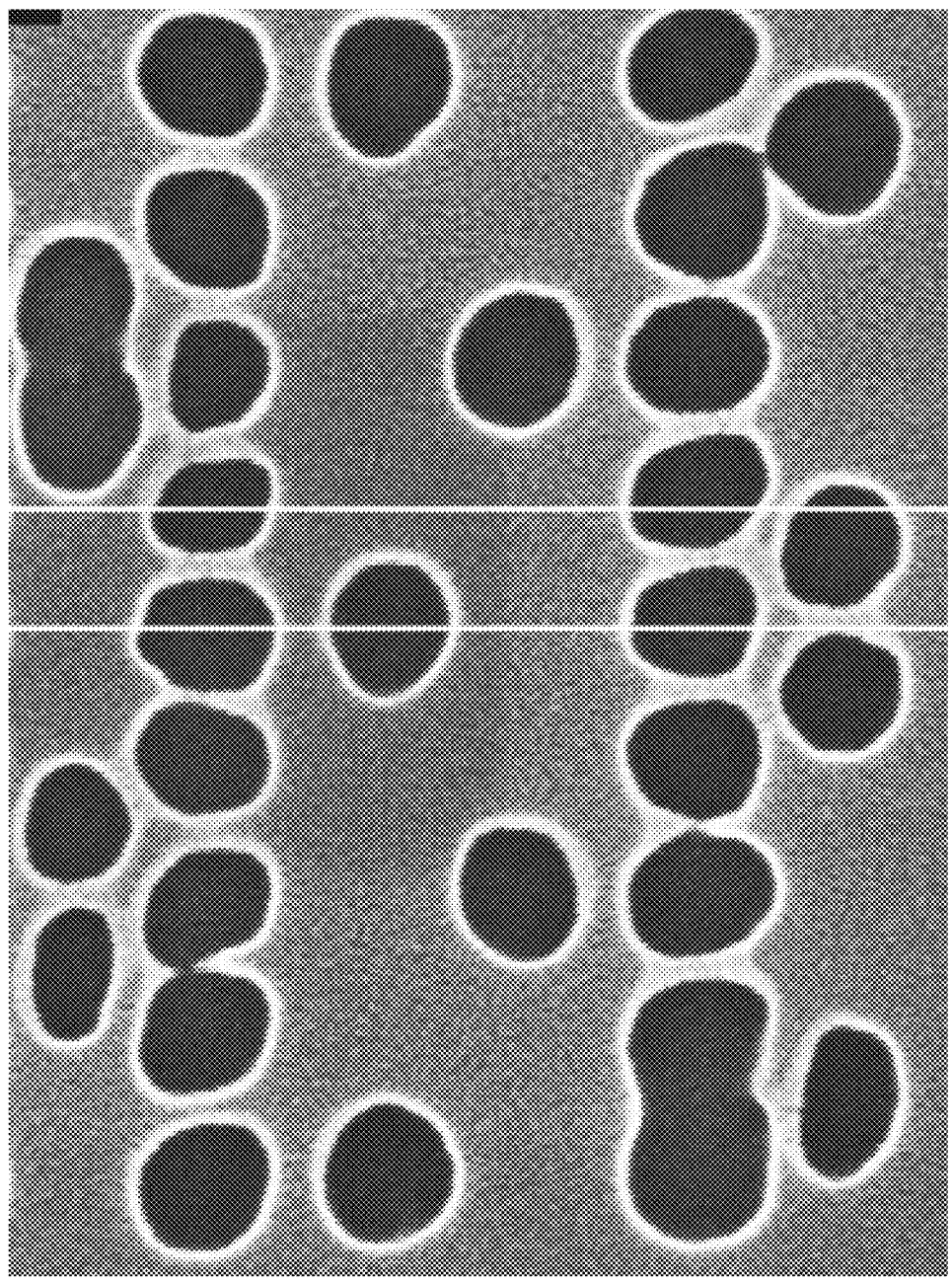
FIGS. 4A and 4B, present scanning electron microscopy (SEM) micrographs related to the implementation shown in FIG. 3.
Figure 4B:
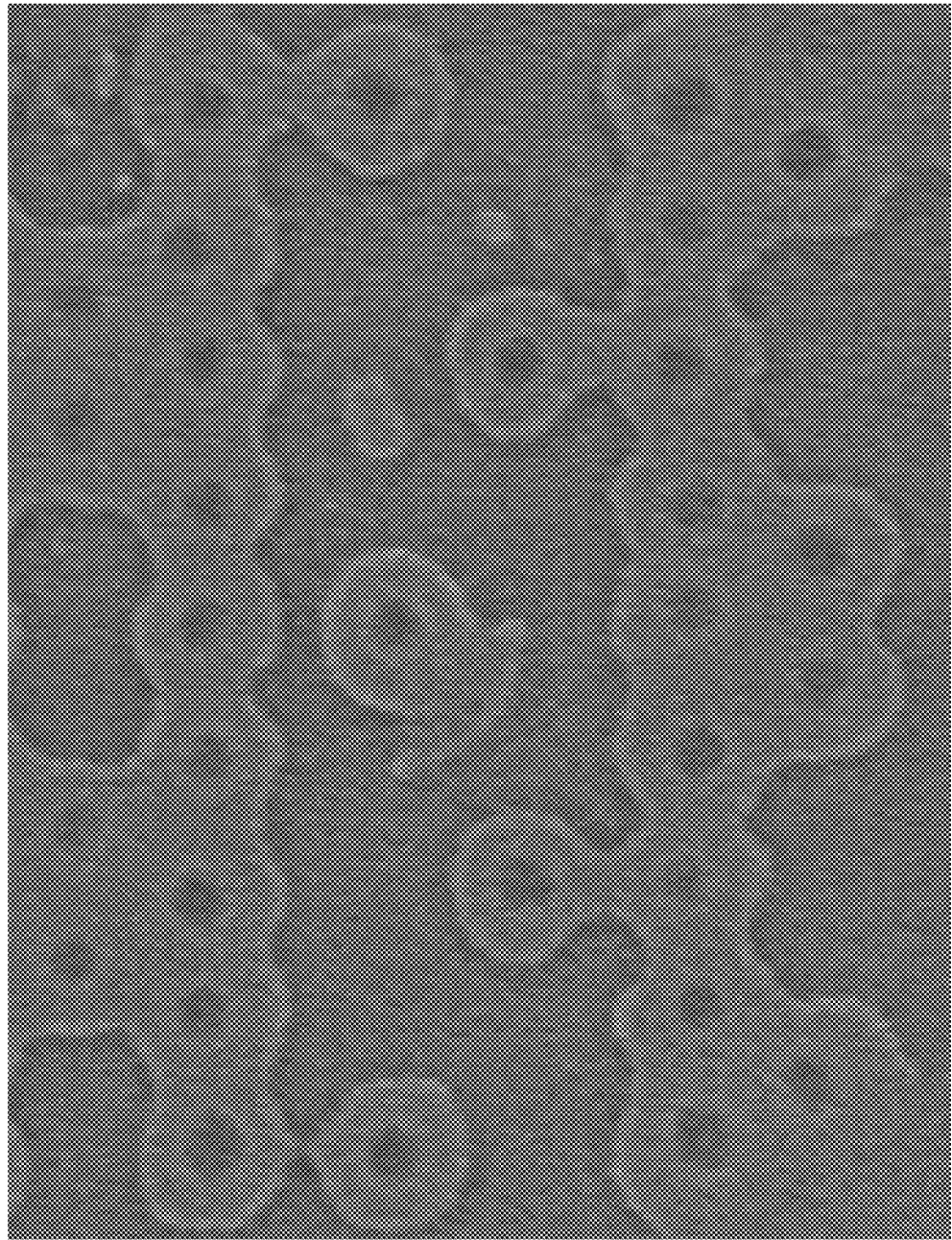

A layer of a di-block copolymer of polystyrene (PS) and polymethylmethacrylate (PS-b-PMMA, 96 kg/mol—35 kg/mol, from polymer source) was spun-cast onto a substrate that included a hardened 193 nm resist (JSR 2073) pattern having non-periodic, discrete openings, many of which included segmented prepatterned openings. (The openings had been previously created in a photoresist on the substrate by e-beam lithography.) FIG. 4A shows this substrate with these initial openings. The polymer was baked at 200° C. for 5 minutes to promote self-assembly of the polymer domains. The self-assembled polymer was then etched in oxygen plasma, thereby removing PMMA and generating the holes shown in FIG. 4B. It can be seen that the size and shape of the prepatterned openings vary significantly, both within an individual segmented prepattern and between segmented prepatterns. The DSA process creates vias with a reduced CD (here: the average diameter) and a reduced percentage variation in the CD of the resulting holes, beginning with either discrete openings or segmented prepatterned openings. The CD of the openings in FIG. 4A is 70 nm, whereas the CD of the resulting vias is 33 nm. The overall SERF is 0.6 in this case, which indicates that the resulting vias had a 40% reduction in the percentage variation of the CD with respect to the percentage variation of the CD of the prepatterned openings.

3. General

Selecting the appropriate polymer for a specific opening can be important to producing vias with an adequate self-healing effect (i.e., reducing the percentage variation in the CD of the resulting vias with respect to the percentage variation in the CD of the initial openings). The molecular weight and composition of block copolymers play a role in their directed self-assembly and self-healing behavior. For a prepattern consisting of circular openings, smaller SERF (larger healing) can be obtained if the natural periodicity of the self-assembled materials is close to the diameter of the prepatterned opening. However, if the opening diameter is greater than about three times the natural periodicity (center-to-center spacing) of the self-assembled material, there is a greater possibility of producing more than one via in the opening. On the other hand, if the opening diameter is much smaller than the natural periodicity, no hole is evident after removing the minority domains from the substrate, since no minority domains form within such a small opening.

Figure 5A:
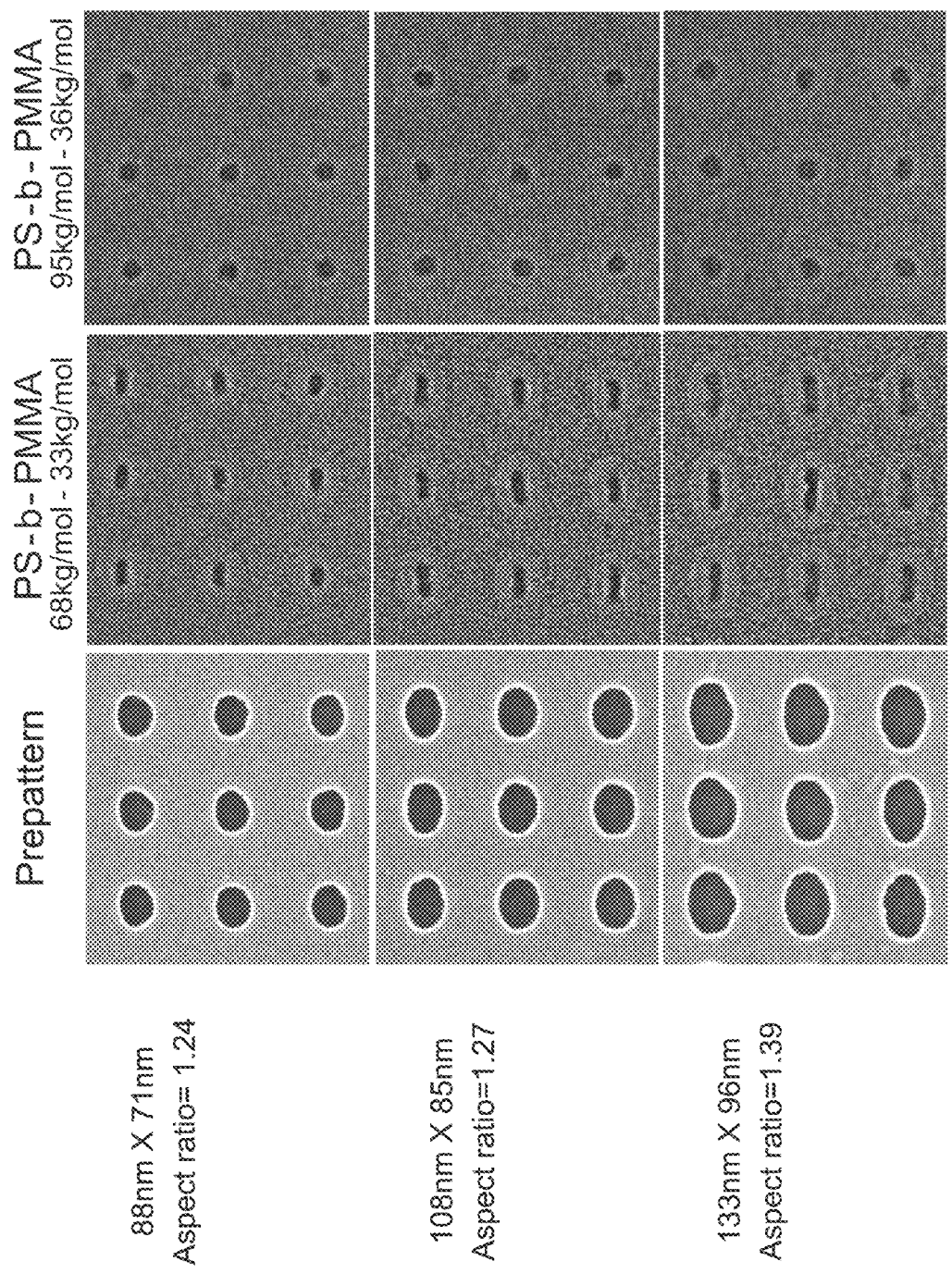
FIG. 5A presents SEM micrographs of an implementation of the invention, in which beginning with oval-shaped openings in a substrate, smaller oval-shaped or circular holes can be formed using a polymer layer including at least a block copolymer, and in which the percentage variation in the CD of the formed holes from self-assembled domains is less than the percentage variation in the CD of the initial openings, and in which FIG. 5B present results deduced from those and other micrographs.
Figure 5B:
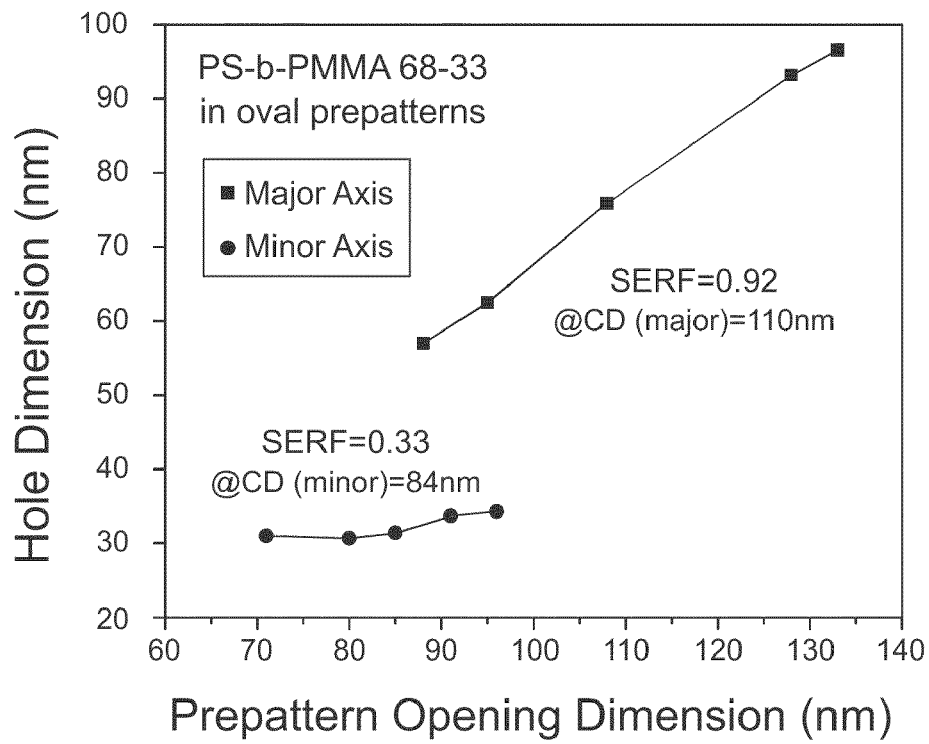
Figure 5B:
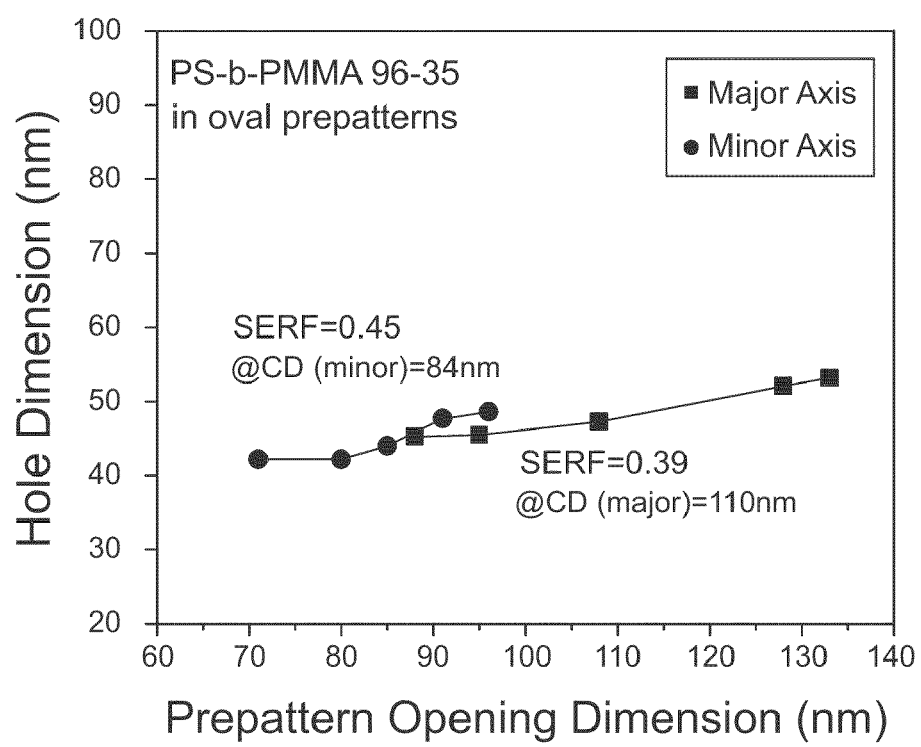

In addition, the self-healing behavior and the shapes of the formed vias are in general a function of both the composition and molecular weight of the block copolymers. FIG. 5A shows SEM images of a prepatterned substrate (having oval-shaped openings therein) and the respective vias formed from the self-assembled domains of PS-b-PMMA (68 kg/mol—33 kg/mol) and PS-b-PMMA (96 kg/mol—35 kg/mol). The eccentricity of the resulting vias from PS-b-PMMA (68 kg/mol—33 kg/mol) increases relative to the eccentricity of the starting oval-shaped openings. A stronger self-healing effect (i.e., smaller SERF) is observed along the minor axis than along the major axis (see FIG. 5B). On the other hand, the resulting vias from PS-b-PMMA (96 kg/mol—35 kg/mol) are nearly circular, and their eccentricity is reduced with respect to the starting oval-shaped openings. A self-healing effect is observed along both the major axis and the minor axis (see FIG. 5B). Moreover, reduced contact edge roughness (CER) is also a consequence of this self-healing. That is, if the initial openings deviate from a circular shape, the resulting holes show relatively less deviation from a circular shape, provided a suitable polymer is selected.

The openings 124 and 324 may be formed by lithographic techniques, e.g., e-beam or optical lithography. In the case of electron-beam lithography, these openings may be generated directly on the resist. If optical lithography is used, a layer of photoresist is formed on a substrate, exposed through a specific mask with optical radiation (e.g., 248 nm or 193 nm ), optionally baked, and treated with developer to produce a topographical photoresist pattern. The exposure may also be performed using immersion lithography. The openings 124 and 324 may be formed using a single exposure or multiple exposure process. DSA can be performed directly in the negative-tone resist pattern. If the DSA is to be performed in the positive-tone resist pattern, some treatment of the resist material may be necessary so that the resist pattern is insoluble in the casting solvent of the block copolymer (and any other additives). For example, treating the positive-tone resist pattern with a surface crosslinking agent or material may be used. Otherwise, the resist pattern can be transferred into the underlying bottom anti-reflective coating, a hardmask layer (e.g., an oxide or nitride material), or a transfer layer (a crosslinked organic resin) followed by removing the resist and optionally modifying the surface. These patterns are generally stable to the block copolymer casting solvents and would not require additional stabilization treatments.

In addition, the openings 124 and 324 may be formed by a double patterning process. In one embodiment, a pattern is imaged into a first photoresist and transferred into an underlying hardmask. After removing the remaining first resist, a second resist is cast onto the patterned hardmask and imaged to form a second photoresist pattern. The second photoresist pattern is then transferred into the hardmask. The transferred (overlapping) patterns from the first and second photoresists are combined in the hardmask layer to form a single segmented pattern which can be used to direct the assembly of the block copolymers.

Once the structures shown in FIGS. 1A and 3A are made, self-assembly of the diblock copolymer on them is carried out. This process is summarized here and described in more detail below. First, a polymer solution containing at least one block copolymer (BCP) is prepared. Additional BCPs, homopolymers, copolymers, surfactants and photoacid generators in the solution may also be employed. Next, the solution is cast on the substrate having the segmented prepattern, to form well-registered polymer domains within the desired area. Increasing the mobility of the block polymers (e.g., through baking or solvent vapor treatment) is required for certain polymers, such as PS-b-PMMA (a di-block copolymer of polystyrene (PS) and polymethylmethacrylate). For block copolymers for which the glass transition temperature is lower than room temperature, spontaneous self-assembly may occur. Additional annealing (including thermal annealing, thermal gradient annealing, solvent vapor annealing or some other gradient field) may be optionally employed to remove any defects. Finally, at least one self-assembled polymer domain is selectively removed to generate holes, which can then be transferred into the underlying substrate. For example, both bilayer (resist and transfer layer) and trilayer (resist, hard mask layer, transfer layer) schemes are possible (see, for example, "Introduction to Microlithography", second edition, edited by Larry F. Thompson, C. Grant Willson and Murrae J. Bowden, American Chemical Society, Washington, DC, 1994). Prior to the pattern development and pattern transfer, the self-assembled polymer may be optionally chemically modified to improve properties necessary for pattern transfer, such as etch resistance or certain mechanical properties.

A copolymer as used herein is a polymer derived from more than one species of monomer. A block copolymer as used herein is a copolymer that comprises more than one species of monomer, wherein the monomers are present in blocks. Each block of the monomer comprises repeating sequences of the monomer. A formula (1) representative of a block copolymer is shown below:

$$-(A)_a-(B)_b-(C)_c-(D)_d \ldots -(Z)_z- \qquad (1)$$

wherein A, B, C, D, through Z represent monomer units and the subscripts "a", "b", "c", "d" through "z", represent the number of repeating units of A, B, C, D through Z, respectively. The above-referenced representative formula is not meant to limit the structure of the block copolymer used in the present invention. The aforementioned monomers of the copolymer may be used individually and in combinations thereof in accordance with the methods of the present invention.

A di-block copolymer has blocks of two different polymers. A formula (2) representative of a di-block copolymer is shown below:

$$-(A)_m-(B)_n- \qquad (2)$$

in which the subscripts "m" and "n" represent the number of repeating units of A and B, respectively. The notation for a di-block copolymer may be abbreviated as A-b-B, where A represents the polymer of the first block, B represents the polymer of the second block, and -b- denotes that it is a di-block copolymer of blocks of A and B. For example, PS-b-PMMA represents a di-block copolymer of polystyrene (PS) and polymethylmethacrylate (PMMA). In addition to linear block copolymers, block copolymers with other architecture also can be used for DSA, e.g., star copolymers, branched copolymers, hyperbranched copolymers, and grafted copolymers.

The blocks can in general be any appropriate microdomain-forming block to which another, dissimilar block can be attached. Blocks can be derived from different polymerizable monomers, where the blocks might include but are not limited to: polyolefins including polydienes, polyethers including poly(alkylene oxides) (such as poly(ethylene oxide), poly(propylene oxide), poly(butylene oxide), or random or block copolymers of these), poly((meth)acrylates), polystyrenes, polyesters, polyorganosiloxanes, polyorganogermanes, and the like.

The blocks of the block copolymer might comprise as monomers $C_{2-30}$ olefinic monomers, (meth)acrylate monomers derived from $C_{1-30}$ alcohols, inorganic-containing monomers including those based on Fe, Si, Ge, Sn, Al, Ti, or a combination comprising at least one of the foregoing monomers. Monomers for use in the blocks might include, as the $C_{2-30}$ olefinic monomers, ethylene, propylene, 1-butene, 1,3-butadiene, isoprene, vinyl acetate, dihydropyran, norbomene, maleic anhydride, styrene, 4-hydroxy styrene, 4-acetoxy styrene, 4-methylstyrene, or α-methylstyrene. The monomers might include, as (meth)acrylate monomers, methyl(meth)acrylate, ethyl(meth)acrylate, n-propyl (meth)acrylate, isopropyl(meth)acrylate, n-butyl(meth)acrylate, isobutyl(meth)acrylate, n-pentyl(meth)acrylate, isopentyl(meth)acrylate, neopentyl(meth)acrylate, n-hexyl(meth)acrylate, cyclohexyl (meth)acrylate, isobornyl(meth)acrylate, or hydroxyethyl (meth)acrylate. Combinations of two or more of these monomers might be used. Blocks which are homopolymers might include blocks prepared using styrene (e.g., polystyrene blocks), or (meth)acrylate homopolymeric blocks such as poly(methylmethacrylate). Random blocks might include, for example, blocks of styrene and methyl methacrylate (e.g., poly(styrene-co-methyl methacrylate)), randomly copolymerized. An alternating copolymer block might include blocks of styrene and maleic anhydride, which is known to form a styrene-maleic anhydride diad repeating structure due to the inability of maleic anhydride to homopolymerize under most conditions (e.g., poly(styrene-alt-maleic anhydride)). It will be understood that such blocks are exemplary and should not be considered to be limiting.

Furthermore, block copolymers that might be suitable for use in the present methods include diblock or triblock copolymers such as poly(styrene-b-vinyl pyridine), poly(styrene-b-butadiene), poly(styrene-b-isoprene), poly(styrene-b-methyl methacrylate), poly(styrene-b-alkenyl aromatics), poly(isoprene-b-ethylene oxide), poly(styrene-b-(ethylene-propylene)), poly(ethylene oxide-b-caprolactone), poly(butadiene-b-ethylene oxide), poly(styrene-b-t-butyl (meth)acrylate), poly(methyl methacrylate-b-t-butyl methacrylate), poly(ethylene oxide-b-propylene oxide), poly(styrene-b-tetrahydrofuran), poly(styrene-b-isoprene-b-ethylene oxide), poly(styrene-b-dimethylsiloxane), poly(methyl methacrylate-b-dimethylsiloxane), or a combination comprising at least one of the foregoing block copolymers.

The block copolymer desirably has an overall molecular weight and polydispersity amenable to further processing. For example, the block copolymer might have a weight-averaged molecular weight ($M_w$) of 3,000 to 400,000 g/mol. Similarly, the block copolymer might have a number averaged molecular weight ($M_n$) of 1,000 to 200,000. The block copolymer might also have a polydispersity ($M_w/M_n$) of 1.01 to 6, and is not particularly limited thereto. Molecular weight, both $M_w$ and $M_n$, can be determined by, for example, gel permeation chromatography using a universal calibration method, calibrated to polystyrene standards.

The block copolymer formulation may be applied by spin coating it onto the substrate, e.g., at a spin speed from about 1 rpm to about 10,000 rpm, with or without a post-drying process. Other processes may be used for applying the block copolymer formulation to the substrate, such as dip-coating and spray-coating.

As used herein, "phase-separate" refers to the propensity of the blocks of the block copolymers to form discrete microphase-separated domains, also referred to as "microdomains" and also simply as "domains". The blocks of the same monomer aggregate to form domains, and the spacing and morphology of domains depends on the interactions, volume fractions, and number of different blocks in the block copolymer. Domains of block copolymers can form spontaneously while applying them to a substrate such as during a spin-casting step, or they can form as a result of an annealing step. "Heating" or "baking" is a general process wherein the temperature of the substrate and coated layers thereon is raised above ambient temperature. "Annealing" can include thermal annealing, thermal gradient annealing, solvent vapor annealing, or other annealing methods. Thermal annealing, sometimes referred to as "thermal curing" is used to induce phase separation, and in addition, can be used as a process for reducing or removing defects in the layer of lateral microphase-separated domains. It generally involves heating at elevated temperature above the glass transition temperature of the block copolymers, for a period of time (e.g., several minutes to several days).

Solvents that can be used vary with the solubility requirements of the block copolymer components and the various additives, if any. Exemplary casting solvents for these components and additives include propylene glycol monomethyl ether acetate (PGMEA), ethoxyethyl propionate, anisole, ethyl lactate, 2-heptanone, cyclohexanone, amyl acetate, γ-butyrolactone (GBL), toluene, and the like.

Additives can be selected from the group consisting of: additional polymers (including homopolymers, star polymers and copolymers, hyperbranched polymers, block copolymers, graft copolymers, hyperbranched copolymer, random copolymers, crosslinkable polymers, and inorganic-containing polymers), small molecules, nanoparticles, metal compounds, inorganic-containing molecules, surfactants, photoacid generators, thermal acid generators, base quenchers, hardeners, cross-linkers, chain extenders, and combinations comprising at least one of the foregoing, wherein one or more of the additives co-assemble with the block copolymer to form part of one or more of the self-assembled domains.

A substrate, as used herein, is physical structure suitable for use with any of the methods described herein, including but not necessarily limited to substrates used in the semiconductor industry. This includes a physical body (e.g., a layer or a laminate, a material, and the like) onto which materials (such as polymers, polymeric materials, metals, oxides, dielectrics, etc.) may be deposited or adhered. The substrates herein may include semiconducting materials, insulating materials, conductive materials, or any combination thereof, including multilayered structures. Thus, for example, a substrate may comprise a semiconducting material such as Si, SiGe, SiGeC, SiC, GaAs, InAs, InP and other III/V or II/VI compound semiconductors. A substrate may comprise, for example, a silicon wafer or process wafer such as that produced in various steps of a semiconductor manufacturing process, such as an integrated semiconductor wafer. A substrate may comprise a layered substrate such as, for example, Si/SiGe, Si/SiC, silicon-on-insulators (SOIs) or silicon germanium-on-insulators (SGOIs). A substrate may comprise one or more layers such as a dielectric layer, a barrier layer for copper such as SiC, a metal layer such as copper, a halfnium dioxide layer, a silicon layer, a silicon oxide layer, the like, or combinations thereof. A substrate may comprise an insulating material such as an organic insulator, an inorganic insulator or a combination thereof including multilayers. A substrate may comprise a conductive material, for example, polycrystalline silicon (polySi), an elemental metal, alloys of elemental metals, a metal silicide, a metal nitride, or combinations thereof, including multilayers. A substrate may comprise ion implanted areas, such as ion implanted source/drain areas having P-type or N-type diffusions active to the surface of the substrate.

The invention may be embodied in other specific forms without departing from its spirit or essential characteristics. The described embodiments are to be considered in all respects only as illustrative and not restrictive. The scope of the invention is therefore indicated by the appended claims rather than the foregoing description. All changes within the meaning and range of equivalency of the claims are to be embraced within that scope.

The invention claimed is:

1. A method, comprising:
providing a substrate with discrete openings whose targeted critical dimension (CD) is less than 200 nm, the openings having a statistical variation in their CD characterized by a standard deviation $\sigma_{openings}$ and an average $CD_{openings}$, with $3\sigma_{openings}$ being at least 10% of the average $CD_{openings}$;
applying, over the substrate, a layer of polymer that includes a block copolymer, wherein components of the copolymer are immiscible with one another;
allowing the polymer to form, inside each of the openings, a self-assembled central domain within a surrounding self-assembled domain; and
selectively removing the central domains, thereby forming a hole where each central domain was located, the holes having a CD statistical variation characterized by a standard deviation $\sigma_{holes}$ and an average $CD_{holes}$;
wherein $\sigma_{holes}$/average $CD_{holes}$ is less than 0.8 of $\sigma_{openings}$/average $CD_{openings}$.

2. The method of claim 1, comprising transferring the holes into the substrate.

3. The method of claim 1, comprising backfilling the holes with a material.

4. The method of claim 1, wherein the substrate includes at least one of: a resist, a hardmask, and an antireflection coating.

5. The method of claim 1, wherein the polymer is annealed, thereby forming the self-assembled central domains and the surrounding self-assembled domains.

6. The method of claim 1, wherein the openings are formed using optical lithography.

7. The method of claim 1, wherein the number of openings having the targeted CD is at least 100.

8. The method of claim 1, wherein the number of openings having the targeted CD is at least 1,000.

9. The method of claim 1, wherein the discrete openings include circular openings, and the targeted critical dimension is a measure of the diameter of the circular openings.

10. The method of claim 1, wherein the discrete openings are oval-shaped.

11. The method of claim 1, wherein $\sigma_{holes}$/average $CD_{holes}$ is less than 0.7 of $\sigma_{openings}$/average $CD_{openings}$.

12. The method of claim 1, wherein $\sigma_{holes}$/average $CD_{holes}$ is less than 0.5 of $\sigma_{openings}$/average $CD_{openings}$.

13. The method of claim 1, wherein the block copolymer is selected from the group consisting of poly(styrene-b-vinyl pyridine), poly(styrene-b-butadiene), poly(styrene-b-isoprene), poly(styrene-b-methyl methacrylate), poly(styrene-b-alkenyl aromatics), poly(isoprene-b-ethylene oxide), poly(styrene-b-(ethylene-propylene)), poly(ethylene oxide-b-caprolactone), poly(butadiene-b-ethylene oxide), poly(styrene-b-t-butyl(meth)acrylate), poly(methyl methacrylate-b-t-butyl methacrylate), poly(ethylene oxide-b-propylene oxide), poly(styrene-b-tetrahydrofuran), and combinations of the foregoing block copolymers.

14. The method of claim 1, wherein the holes are arranged in a periodic array.

15. The method of claim 1, wherein the holes do not form a periodic array.

16. A method, comprising:
providing a plurality of substrates each of which has openings whose targeted diameter is less than 200 nm, wherein the targeted diameter is the same for each of the substrates, the openings having average diameters having a statistical variation, for all of said openings in said substrates, characterized by a standard deviation $\sigma_{openings}$ and an average diameter$_{openings}$, with $3\sigma_{openings}$ being at least 10% of the targeted diameter;
applying, over each of the substrates, a layer of polymer that includes a block copolymer, wherein components of the copolymer are immiscible with one another;
allowing the polymer to form, inside each of the openings in each of the substrates, a self-assembled central domain within a surrounding self-assembled domain; and
selectively removing the central domains in each of the substrates, thereby forming a hole where each central domain was located, the holes having respective diameters and a statistical variation in their diameters, for all of said holes in said substrates, characterized by a standard deviation $\sigma_{holes}$ and an average diameter$_{holes}$;
wherein $\sigma_{holes}$/average diameter$_{holes}$ is less than 0.8 of $\sigma_{openings}$/average diameter$_{openings}$.

17. The method of claim 16, wherein the method is applied to the substrates concurrently.

18. The method of claim 16, wherein the method is applied to the substrates sequentially, to one substrate after another.

19. A method, comprising:
providing a substrate having a surface with an opening therein, the opening having a boundary equivalent to that formed from overlapping holes whose targeted diameter is less than 200 nm, the holes having sidewalls that define protrusions where the sidewalls adjoin, the overlapping holes having respective diameters and a statistical variation in their diameters characterized by a standard deviation $\sigma_{overlapping\ holes}$ and an average diameter$_{overlapping\ holes}$;

applying, over the surface, a layer of polymer that includes a block copolymer, wherein components of the copolymer are immiscible with one another;

allowing the polymer to form a single discrete, segregated domain inside each portion of the opening corresponding to one of the holes, and removing at least some of the discrete, segregated domains, thereby forming holes, the formed holes having respective diameters and a statistical variation in their diameters characterized by a standard deviation $\sigma_{formed\ holes}$ and an average diameter$_{formed\ holes}$, wherein:

i) the position of each discrete, segregated domain is predetermined by at least one sidewall and a protrusion that forms at least part of said at least one sidewall, ii) the domains have respective geometric centers, and for any given domain, its center and the center of the given domain's nearest neighbor are separated by a distance that is less than the sum of the average radii of curvature of the holes corresponding to the sidewalls that predetermine the positions of the given domain and the given domain's nearest neighbor, and iii) $\sigma_{formed\ holes}$/average diameter$_{formed\ holes}$ is less than $\sigma_{overlapping\ holes}$/average diameter$_{overlapping\ holes}$.

20. The method of claim 19, further comprising transferring the formed holes into the substrate.

21. The method of claim 19, wherein $3\sigma_{overlapping\ holes}$ is at least 10% of the targeted diameter.

22. The method of claim 19, wherein $\sigma_{formed\ holes}$/average diameter$_{formed\ holes}$ is less than 0.8 of $\sigma_{overlapping\ holes}$/average diameter$_{overlapping\ holes}$.

* * * * *